US012648489B2

(12) United States Patent
Takashima

(10) Patent No.: US 12,648,489 B2
(45) Date of Patent: Jun. 2, 2026

(54) OUTPUT MATCHING NETWORK TO REDUCE SELF AND MUTUAL INDUCTANCES OF OUTPUT INDUCTIVE COMPONENTS IN A CAVITY PACKAGE

(71) Applicant: SUMITOMO ELECTRIC DEVICE INNOVATIONS, INC., Yokohama (JP)

(72) Inventor: Seiya Takashima, Coppell, TX (US)

(73) Assignee: SUMITOMO ELECTRIC DEVICE INNOVATIONS, INC., Yokohama (JP)

( * ) Notice: Subject to any disclaimer, the term of this patent is extended or adjusted under 35 U.S.C. 154(b) by 367 days.

(21) Appl. No.: 18/214,530

(22) Filed: Jun. 27, 2023

(65) Prior Publication Data

US 2025/0006688 A1    Jan. 2, 2025

(51) Int. Cl.
  *H10W 90/00*      (2026.01)
  *H10W 44/20*      (2026.01)
      (Continued)

(52) U.S. Cl.
  CPC ......... *H10W 90/00* (2026.01); *H10W 44/206* (2026.01); *H10W 44/234* (2026.01);
      (Continued)

(58) Field of Classification Search
  CPC ......... H01L 24/49; H01L 24/48; H01L 25/16; H01L 24/85; H01L 2224/48091; H01L 2224/48153; H01L 2224/48195; H01L 2224/48245; H01L 2224/49051; H01L 2224/49052; H01L 2224/85947; H01L 2924/1033; H01L 2924/13064; H01L 2924/30107; H01L 2223/6611;
      (Continued)

(56) References Cited

U.S. PATENT DOCUMENTS

| | | | |
|---|---|---|---|
| 4,200,880 A | * | 4/1980 | Frey ........................ H01L 24/49 |
| | | | 257/532 |
| 5,457,340 A | * | 10/1995 | Templeton, Jr. ............................. |
| | | | H01L 23/49503 |
| | | | 257/691 |

(Continued)

FOREIGN PATENT DOCUMENTS

| | | | | | |
|---|---|---|---|---|---|
| CN | 101176205 A | * | 5/2008 | ............. | H01L 23/66 |
| CN | 106206552 A | * | 12/2016 | ............. | H01L 23/66 |

(Continued)

*Primary Examiner* — Earl N Taylor
(74) *Attorney, Agent, or Firm* — XSENSUS LLP

(57)         ABSTRACT

A semiconductor device includes a cavity package including a substrate and at least one output lead disposed higher than the substrate, in a side view, to create a cavity. A transistor die is disposed within the cavity. A top surface of the transistor die is lower than a top surface of the output lead when viewed in the side view. A first substrate is disposed within the cavity and is separate from the transistor die. A top surface of the first substrate is lower than the top surface of the output lead in the side view. A shunt wire connects an output of the transistor die to the first substrate, and an output wire connects the output of the transistor substrate to the output lead. The shunt wire or the output wire is disposed and shaped to minimize self-inductance and to minimize mutual inductance with the shunt wire.

20 Claims, 6 Drawing Sheets

(51) Int. Cl.
  *H10W 72/00*     (2026.01)
  *H10W 72/50*     (2026.01)

(52) U.S. Cl.
  CPC ... *H10W 72/01551* (2026.01); *H10W 72/537* (2026.01); *H10W 72/075* (2026.01); *H10W 72/07553* (2026.01); *H10W 90/751* (2026.01); *H10W 90/757* (2026.01); *H10W 90/759* (2026.01)

(58) Field of Classification Search
  CPC ..... H01L 2223/6644; H01L 2223/6655; H01L 23/66; H10W 90/00; H10W 44/206; H10W 44/234; H10W 72/01551; H10W 72/537; H10W 72/075; H10W 72/07553; H10W 90/751; H10W 90/757; H10W 90/759; H10W 44/226; H10W 90/756; H10W 44/20
  See application file for complete search history.

(56) References Cited

U.S. PATENT DOCUMENTS

| | | | | | |
|---|---|---|---|---|---|
| 5,880,517 | A * | 3/1999 | Petrosky | .................. | H01L 24/49 |
| | | | | | 257/532 |
| 7,276,420 | B2 * | 10/2007 | Liu | .......................... | H01L 24/49 |
| | | | | | 438/210 |
| 7,986,184 | B2 * | 7/2011 | Besling | ................. | H01L 23/642 |
| | | | | | 330/307 |
| 9,589,927 | B2 * | 3/2017 | Szymanowski | ....... | H03F 1/0288 |
| 9,621,115 | B1 * | 4/2017 | Wu | ........................ | H03F 1/0288 |
| 9,628,027 | B2 * | 4/2017 | Embar | ...................... | H03F 3/68 |
| 9,941,227 | B2 * | 4/2018 | Zhu | .......................... | H01L 23/66 |
| 2002/0163018 | A1 * | 11/2002 | Kamiya | .................. | H01L 24/49 |
| | | | | | 257/208 |
| 2006/0170079 | A1 * | 8/2006 | Brennan et al. | ........ | H01L 24/85 |
| | | | | | 257/E23.185 |
| 2011/0148529 | A1 * | 6/2011 | Besling | ................... | H01L 23/66 |
| | | | | | 330/306 |
| 2012/0146723 | A1 * | 6/2012 | Blednov | ................ | H01L 23/66 |
| | | | | | 330/192 |
| 2013/0265107 | A1 * | 10/2013 | Holmes | .................. | H01L 23/64 |
| | | | | | 330/124 R |
| 2014/0027906 | A1 * | 1/2014 | Narita | ..................... | H01L 24/48 |
| | | | | | 257/784 |
| 2015/0294930 | A1 * | 10/2015 | Zhu | ..................... | H01L 23/4952 |
| | | | | | 257/337 |
| 2016/0142015 | A1 * | 5/2016 | Volokhine | ............ | H03F 1/0205 |
| | | | | | 330/307 |
| 2016/0142025 | A1 * | 5/2016 | Volokhine | .............. | H01L 24/49 |
| | | | | | 330/307 |
| 2017/0117239 | A1 * | 4/2017 | Lembeye | ................ | H03F 1/565 |
| 2019/0229077 | A1 * | 7/2019 | De Boet | ................. | H01L 23/66 |
| 2020/0204121 | A1 * | 6/2020 | Zhu | ..................... | H01L 23/4952 |
| 2020/0204122 | A1 * | 6/2020 | Zhu | ......................... | H01L 23/66 |
| 2021/0035942 | A1 * | 2/2021 | Vaswani | ................ | H01L 24/49 |
| 2021/0210444 | A1 * | 7/2021 | Ward | ..................... | H03F 1/565 |
| 2021/0225784 | A1 * | 7/2021 | Shilimkar | .............. | H01L 24/48 |
| 2022/0037464 | A1 * | 2/2022 | Zhao | ........................ | H01L 24/06 |
| 2022/0392857 | A1 * | 12/2022 | Rice | ..................... | H03F 1/0288 |
| 2023/0124581 | A1 * | 4/2023 | Lee | ..................... | H01L 23/3171 |
| | | | | | 257/401 |

FOREIGN PATENT DOCUMENTS

| | | | | | |
|---|---|---|---|---|---|
| JP | | H11111750 A | * | 4/1999 | ............. H01L 24/48 |
| WO | WO-2021202358 A1 | * | 10/2021 | ............. H03F 3/193 |

* cited by examiner

OUTPUT MATCHING NETWORK TO REDUCE SELF AND MUTUAL INDUCTANCES OF OUTPUT INDUCTIVE COMPONENTS IN A CAVITY PACKAGE

BACKGROUND

Technical Field

The present disclosure relates to an output matching network to reduce self and mutual inductances of inductive components within a cavity of a cavity package, and method for manufacturing the same.

Discussion of Background

Radio frequency (RF) power amplifiers are used in a variety of applications including base stations for wireless communications, such as cellular communications. Signals amplified by the RF power amplifier include signals having high frequency modulated carrier signals. For example, a base band signal of significantly lower frequency is used to modulate a high frequency carrier signal, and a ratio of the resulting signal's bandwidth to the frequency of the carrier signal is the relative bandwidth of the modulated carrier signal. The operational bandwidth (relative bandwidth or fractional bandwidth) of an RF power amplifier is required to cover the entire bandwidth of the modulated carrier signal. Given demands for wider band signals and/or multi carrier signals, the operational bandwidth requirement for an RF power amplifier can be 20% or more in fraction.

Conventional RF power amplifiers typically output 40 W to 60 W of power, or more, with input and output ports terminated in a 50 Ohm impedance. This, however, can cause a bottleneck in the RF power amplifier because the optimum load impedance of the typical switching device within the RF power amplifier is much less than 10 Ohms, which is much lower than the 50 Ohm termination. Moreover, the impedance is likely to be dispersive throughout the range of frequencies for a large operational bandwidth. At the frequencies in which RF power amplifiers operate, performance is very sensitive to output impedance mismatches, and significant degradation can result even for relatively small mismatches. Therefore, wideband output impedance matching is crucial for maintaining RF power amplifier performance in broadband and/or large operational bandwidth applications.

Conventional RF power amplifiers typically use semiconductor switching devices, such as GaN HEMT devices, to amplify signals. For thermal management reasons, the packages of these devices typically include a base metal with input and output leads insulated from the base metal and placed higher than the base metal, for example 600 μm higher than the base metal for a transistor device that is 100 μm thick. As a result, wires connecting the transistor device to the leads can lead to parasitic inductances cause by the length and shape of the wires connecting the output of the transistor to a corresponding output lead and to a capacitor meant to cancel other parasitic inductances. The parasitic inductances of the wires stem from self and mutual inductances of the wires.

SUMMARY

According to an exemplary aspect of the disclosure, a semiconductor device includes a cavity package including a substrate and at least one output lead disposed higher than the substrate, in a side view, to create a cavity. A transistor die is disposed within the cavity. A top surface of the transistor die is lower than a top surface of the output lead when viewed in the side view. A first substrate is disposed within the cavity and is separate from the transistor die. A top surface of the first substrate is lower than the top surface of the output lead in the side view. A shunt wire connects an output of the transistor die to the first substrate, and an output wire connects the output of the transistor substrate to the output lead. The shunt wire or the output wire is disposed and shaped to minimize self-inductance and to minimize mutual inductance with the shunt wire.

BRIEF DESCRIPTION OF THE DRAWINGS

A more complete appreciation of the disclosure and many of the attendant advantages thereof will be readily obtained as the same becomes better understood by reference to the following detailed description when considered in connection with the accompanying drawings, wherein.

DETAILED DESCRIPTION

As used herein, an element or step recited in the singular and proceeded with the word "a" or "an" should be understood as not excluding plural elements or steps, unless such exclusion is explicitly recited. Furthermore, references to "one embodiment" of the present disclosure are not intended to be interpreted as excluding the existence of additional embodiments that also incorporate the recited features.

Figure 1:
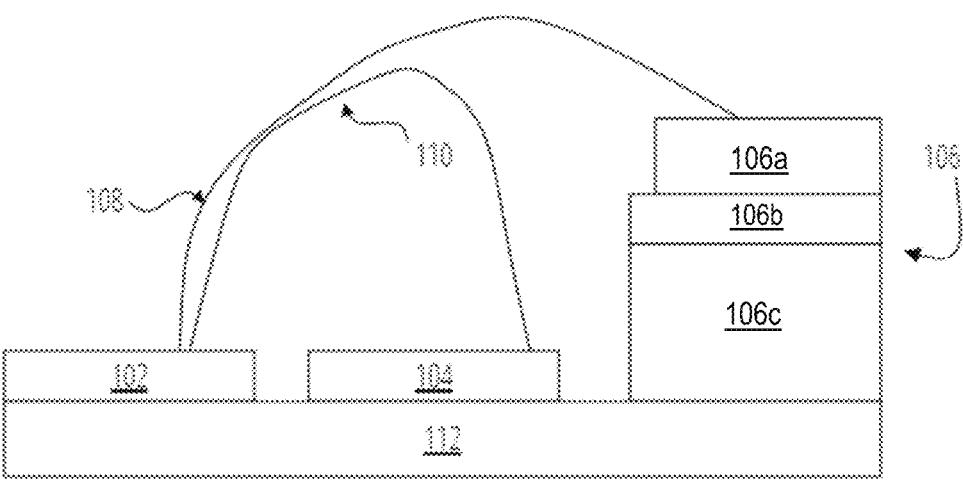
FIG. 1 is a side view of a cavity package including a transistor device, substrate, wiring, and output lead.

FIG. 1 is a side view of cavity package with an output wire 108 and a shunt wire 110 before being bent into a shape that reduces mutual inductance and self-inductance according to exemplary aspects of the present disclosure. The cavity package includes a base metal 112 on which a transistor die 102, substrate 104, and output lead 106 are disposed. As can be appreciated the transistor die may be a GaN high electron mobility transistor (HEMT). However, other transistor devices are also possible without departing from the scope of the present disclosure.

The substrate 104, together with the inductance of the shunt wire 110 form an output matching network. In one exemplary aspect, the substrate 104 may be a capacitive substrate, but the substrate 104 may be an inductive substrate or may exhibit both capacitance and inductance. Thus, the specific structure and properties of the substrate 104 is not limiting upon the present disclosure.

As can be seen from FIG. 1, the output lead 106 is higher than the transistor die 102 and the substrate 104. In one aspect, the output lead may be formed of several layers 106a, 106b, 106c of materials including semiconductor materials, resistive materials, conductive materials, insulator/insulative materials, etc. For example, the layer 106c may be a ceramic layer and the layer 106b may be a thin metallization layer upon which the conductive lead 106a is attached. Unless otherwise stated, the output lead 106 including the different layers 106a, 106b, and 106c will simply be referred to as the output lead 106 in this description.

Of course, other structures for the output lead are possible. For example, the output lead may be a two-layer structure: the conductive lead 106a and an insulative plastic (not shown) that insulates the conductive lead 106a from the base metal 112. The output lead 106 may also be composed of a single material except that the output lead should be isolated from the base metal 112.

As noted above, a shunt wire 110 and a substrate 104 are used as an output matching network. The shunt wire 110 is connected to the output of the transistor die 102 and to the substrate 104, which by virtue of being disposed on the base metal 112 is connected to ground. Thus, the shunt wire 110 and the substrate 104 form an inductive/capacitive (L-C) circuit.

An output wire 108 is also connected to the output of the transistor die 102 and connected to the output lead 106. Thus, the output wire 108 transfers the output of the transistor die 102 to the output lead 106.

As can be seen from FIG. 1, the output wire 108 and the shunt wire 110 are both upwardly convex and may be parallel to each other for at least a portion of their lengths. This can cause mutual inductance between the output wire 108 and the shunt wire 110, and the upwardly convex shape of the output wire can also cause self-inductance in the output wire 108. The mutual inductance and self-inductance are parasitic in that they are not desirable and may degrade the performance of the circuit.

Figure 2:
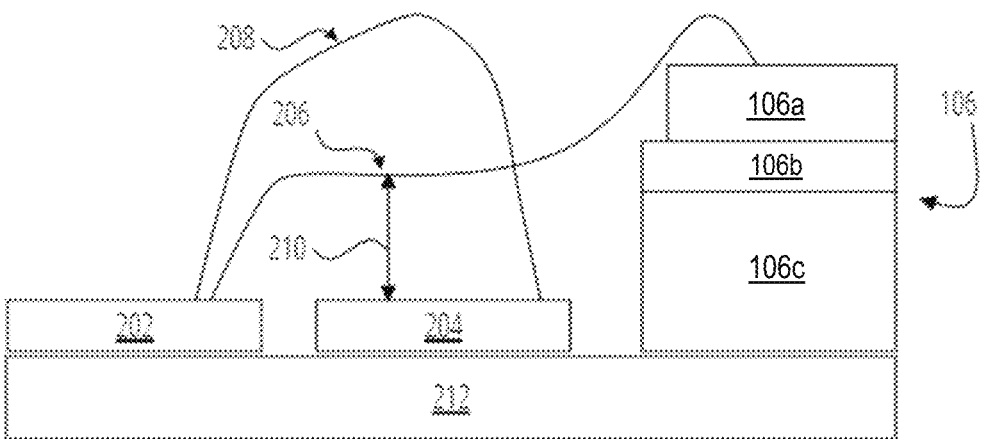
FIG. 2 is a side view of a cavity package including a transistor device, substrate, wiring, and output lead according to exemplary aspects of the present disclosure.

FIG. 2 is another side view of the cavity package according to exemplary aspects of the present disclosure. In FIG. 2, the shunt wire 208 connecting the transistor die 102 to substrate 204 remains in substantially the same orientation as in FIG. 1. However, the output wire 206 is bent so that a portion thereof is no higher than a distance 210 from the surface of the substrate 204. This causes the shunt wire 208 and the output wire 206 to intersect at a substantially right angle thereby minimizing the distance in which the shunt wire 208 and the output wire 206 are parallel. This minimizes the mutual inductance between the shunt wire 208 and the output wire 206 and reduces the parasitic effects of the mutual inductance on the device's performance. Maintaining a portion of the output wire 206 at a distance 210 from the surface of the transistor die 202, or less, also reduces the self-inductance in the output wire, thereby reducing the parasitic effects of the self-inductance on the device's performance. The base metal 212 is the same as the base metal 112 of FIG. 1 and is therefore not described further for the sake of brevity.

Figure 3:
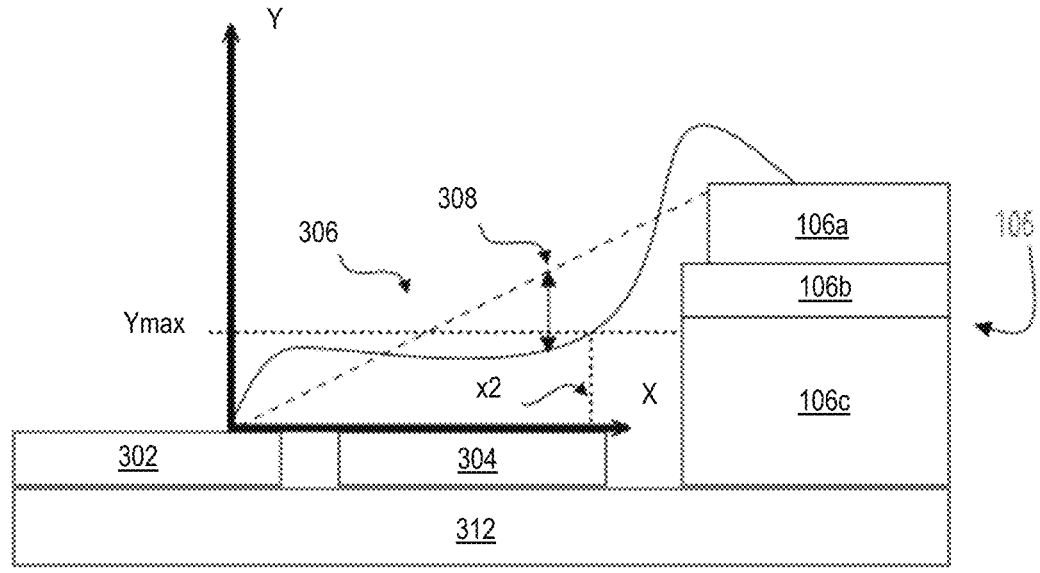
FIG. 3 is another side view of the cavity package including a transistor device, substrate, wiring, and output lead according to exemplary aspects of the present disclosure.

The distance 210 may be determined as illustrated in FIG. 3. In FIG. 3, the distance 210 is determined based on the point P (x1,y1) calculated as the difference 308 between a straight line projected between the bonding point on the transistor die 302 and the bonding point on the output lead 106, given by y=f(x), and the projection of the output wire 208, given by y=g(x). Namely, the distance P(x1,y1)=g(x)−f(x), such that x1 is on the middle of the wire, and g(x1)−f(x1) may be, for example, 100 μm. The transistor die 302, substrate 304, and base metal 312 of FIG. 3 is the same as the transistor die 102, substrate 104, and base metal of 112 and are therefore not described further.

The shape of the output wire 306 may be described as illustrated in FIG. 3 In the coordinate system shown in FIG. 3, the projection of the output wire 306 can be described as y=g(x). Since self inductance depends on height of each portion of the wire 306, it is desirable to make g(x) low for a large portion of the x coordinates. However, since wires are naturally upwardly convex, a wire cannot be put lower than straight line projected between the bonding point on the transistor die 302 and the edge of the lead 106, given by y=f(x). In other words, g(x) is always larger than f(x). Aspects of the present disclosure enable g(x) to be smaller than f(x), and the effect can be quantified by some standards defined by g(x) and f(x). One example is a furthest distance D and position x1 which is defined as D=max(f(x)−g(x)), and x1 is such x. D describes how much the wire 306 is made lower than the limit of a conventional wire and can be the design target. For example, D>=100 um The shape of the output wire 306 may be described by another pair of parameter Ymax and x2, where Ymax is the value that determines the height and x2 is the x-position that output wire crosses the height of Ymax, x2 and Ymax had relationship of Ymax=f(x2), and these parameters ensure that the output wire is lower than Ymax for portion defined with x2. For example, as a design target of wire 306, Ymax can be set to 200 μm, and x2 can be set to more than 60% of full extension of 306 on x-axis, while this fraction is usually lower than 30% for straight wire 308.

As can be appreciated, the section of output wire 306 kept at the distance 210 (shown in FIG. 2) from the substrate (or base metal 312) may be longer than any other section of the output wire 306 (or 208 in FIG. 2). For example, only a small portion of the output wire 208/306 needed to rise to the level of the output lead 106 may be greater than the distance 210. However, in exemplary aspects of the cavity package illustrated in FIG. 2, other portions of the output wire 208 may also exceed the distance 210 as can be appreciated, except that at least some portion of the output wire 208 should be no higher than the distance 210 from the substrate 204.

In the above discussion with respect to FIG. 2, the distance 210 of the output wire 208 is determined relative to the transistor die 202. However, this is only exemplary. The distance 210 may also be determined relative to the substrate 204, which may be a different thickness than the transistor die 202, or may be determined relative to the base metal 212. In fact, it may be preferable to determine the distance relative to the base metal 212 in order to remove the variability in thicknesses of the substrates within the cavity from the calculation. The distance 210 may also be computed relative to the top of the output lead 106, as one of ordinary skill would recognize.

Figure 4:
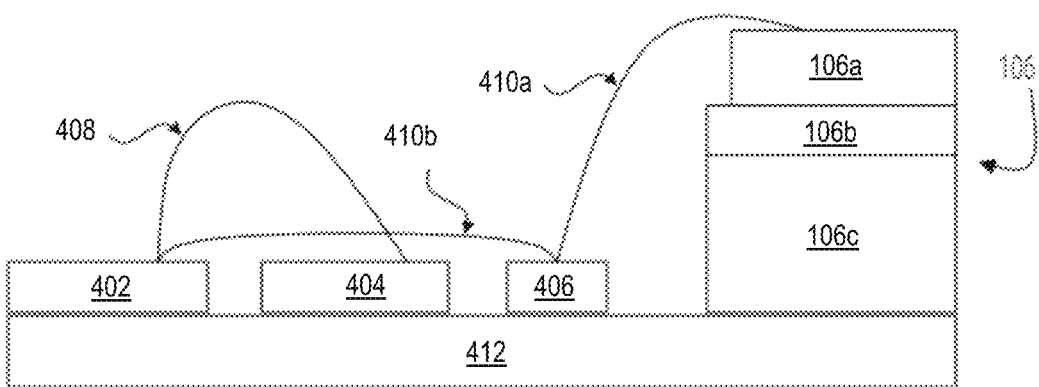
FIG. 4 is a side view of a cavity package including a transistor device, first and second substrates, wiring, and an output lead according to exemplary aspects of the present disclosure.

FIG. 4 is a side view of another cavity package according to exemplary aspects of the present disclosure. In FIG. 4, the output wire 410 is split into two output wires 410*a* and 410*b*. output wire 410*a* connects the output of the transistor die 402 to a substrate 406, and output wire 410*a* connects the substrate 406 to the output lead 106. The output wire 410*b* is kept as low as possible, and at least lower than the shunt wire 408 and the top of the output lead 106. The design target can be defined as, for example, D>=50~300 μm, or x2 is over 40~80% against the full length for Ymax=50~300 μm.

The substrate 406 is placed between the substrate 404, which serves substantially the same function as the substrate 104 of FIG. 1, and the output lead 106. As illustrated in FIG. 4, this causes the output wire 410*b* to be longer than the output wire 410*a*. However, the substrate 406 may also be placed between the transistor die 402 and the substrate 404, which results in the output wire 410*a* being longer than the output wire 410*b*. If the output wire 410*a* is longer than the output wire 410*b*, the bulk of the length of the output wire 410*a* should be kept as low as possible to reduce self-inductance. Also, regardless of which of the output wire 410*a* and the output wire 410*b* is longer, or whether they are of equal length, whichever of the two output wires 410*a* and 410*b* crosses the shunt wire 408 should do so at a substantially right angle with respect to the shunt wire 408 to reduce mutual inductance.

As can be appreciated, the substrate 406 may be inductive, capacitive, or a combination of inductive and capacitive. Further the substrates 406 and 404 may both be of the same type, inductive or capacitive or a combination, or may be of different types without departing from the scope of the present disclosure. Likewise, the dimensions of the substrates 406 and 404 are not limiting upon the present disclosure and may be larger or smaller than illustrated in FIG. 4 (or any other of the figures). The substrates 406 and 404 may also be of the same thickness or different thicknesses and may be as thick, thicker, or thinner than the transistor die 402 without limitation.

Of course, FIG. 4 also illustrates that the transistor die 402, the substrates 406 and 404, and the output lead 106 are disposed on a base metal 412. However, since the base metal 412 is the same as the base metals 112, 312, and 212 described above, further description is omitted for brevity.

Figure 5:
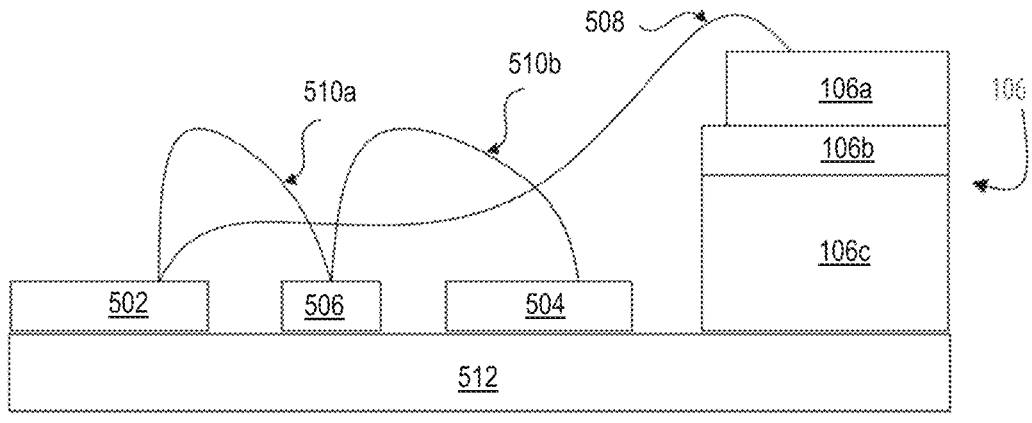
FIG. 5 is a side view of a cavity package including a transistor device, first and second substrates, wiring, and an output lead according to exemplary aspects of the present disclosure.

Next another exemplary configuration of the wiring within a cavity package is described with respect to FIG. 5. In FIG. 5, the base metal 512, transistor die 502, and substrates 506 and 504 are substantially the same as, for example, the base metal 412, transistor die 402, substrates 406 and 404, described above. However, the shunt wire 510 is divided into two shunt wires 510*a* and 510*b*. Shunt wire 510*a* connects the output of the transistor die 502 to the substrate 506, and shunt wire 510*b* connects the substrate 506 to the substrate 504. An output wire 508 connects the output of the transistor die 502 to the output lead 106.

As illustrated in FIG. 5, the output wire 508 remains lower than the shunt wires 510*a* and 510*b* for at least a portion of its length. The output wire 508 also crosses the shunt wires 510*a* and 510*b* at substantially right angles to minimize mutual inductance between the output wire 508 one or more of the shunt wires 510*a* and 510*b*. Though the output wire 508 is illustrated as crossing both shunt wires 510*a* and 510*b*, the output wire 508 may cross only one of the shunt wires 510*a* or 510*b* as one of ordinary skill would recognize. The design target can be defined as, for example, D>=50~300 μm, or x2 is over 40~80% against the full length for Ymax=50~300 μm.

The shunt wires 510*a* and 510*b* may be of equal length or one may be longer than the other without limitation. Thus, the relative positions of the substrates 506 and 504 may be adjusted with respect to each other as necessary, and may also be adjusted with respect to the transistor die 502 and the output lead 106.

Both shunt wires 510*a* and 510*b* may be kept at a same distance relative to the top of the output lead 106, but this is not limiting. For example, the shunt wire 510*a* may be higher, or lower, than the shunt wire 510*b*. As in the previously described configuration, the exact dimensions of the substrates 506 and 504, and their electrical characteristics (inductive/capacitive) is not limiting upon this disclosure.

Figure 6:
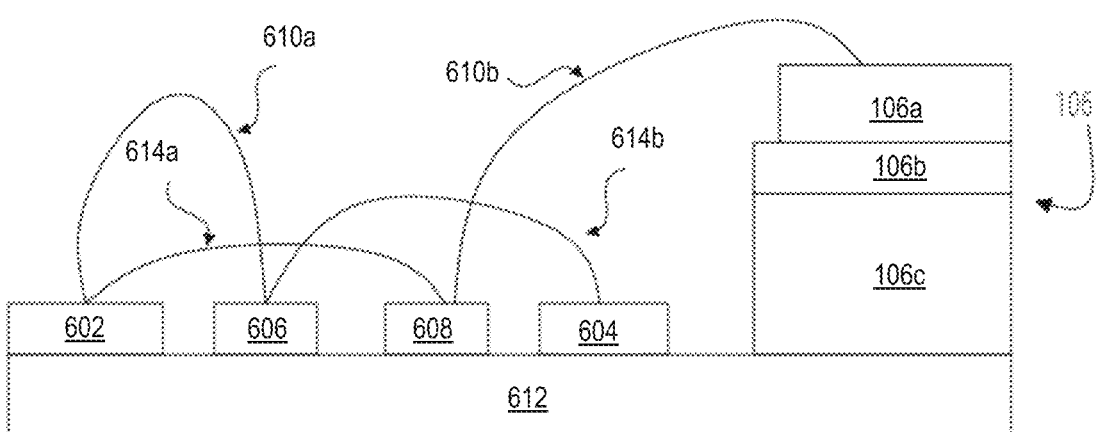
FIG. 6 is a side view of a cavity package including a transistor device, first and second substrates, wiring, and an output lead according to exemplary aspects of the present disclosure.

FIG. 6 is another exemplary configuration of the wiring within a cavity package. As illustrated in FIG. 6, both the output wire 614 and the shunt wire 610 are split in two. Specifically, the output wire 614 is split into output wire 614*a* and output wire 614*b*, and the shunt wire 610 is split into shunt wire 610*a* and shunt wire 610*b*. Output wire 614*a* is kept as low as possible and at least lower than the shunt wires 610*a* and 610*b*. To the extent that the output wires 614*a* and 614*b* cross one or more of the shunt wires 610*a* and 610*b*, they do so at substantially right angles to minimize self-inductance. The design target can be defined as, for example, D>=50~300 μm, or x2 is over 40~80% against the full length for Ymax=50~300 μm.

Substrates 606 and 608 are respectively used to split the shunt wire 610 and the output wire 614. For example, the output wire 614*a* connects the output of the transistor die 602 to the substrate 608, and the output wire 614*b* connects the substrate 608 to the output lead. The shunt wire 610*a* connects the output of the transistor die 602 to the substrate 606, and the shunt wire 610*b* connects the substrate 606 to the substrate 604. Similarly to the substrates described above, the substrates 604, 606, and 608 may be capacitive, inductive, or a combination, without limitation. Likewise, the dimensions of the substrates 604, 606, and 608 may be varied without limitation.

In FIG. 6, the substrate 606 is closer to the transistor die 602 than the substrate 608, but the positions of the substrates 606 and 608 may be swapped without departing from the scope of the present disclosure. The substrate 608 may also be placed between the substrate 604 and the output lead 106. The base metal 612 is the same as the previously described base metals.

Preferably, the shunt wire 610*a* is higher than the shunt wire 610*b* and the output wire 614*a*. However, depending on other design considerations the shunt wire 610*a* may be lower or equal in height to the shunt wire 610*b* as long as the output wire 614*a* remains below both shunt wires 610*a* and 610*b*.

The lengths of the output wires 614*a* and 614*b* may be the same or different with, for example, the output wire 614*a* being longer than the output wire 614*b*. Likewise the lengths of the shunt wires 610*a* and 610*b* may be the same or may be different.

In the above descriptions with respect to FIGS. 1-6, the cavity packages are described with respect to cross sectional views. However, one of ordinary skill will recognize the cavity package may include multiple transistor dies and/or multiple transistors on one die, and corresponding substrates, which require multiple output wires and shunt wires. In this case, the shunt wires and output wires for all of the transistors may be configured the same, such as in any one of FIGS. 1-6, or some may be configured differently from the others based on design requirements.

Figure 7:
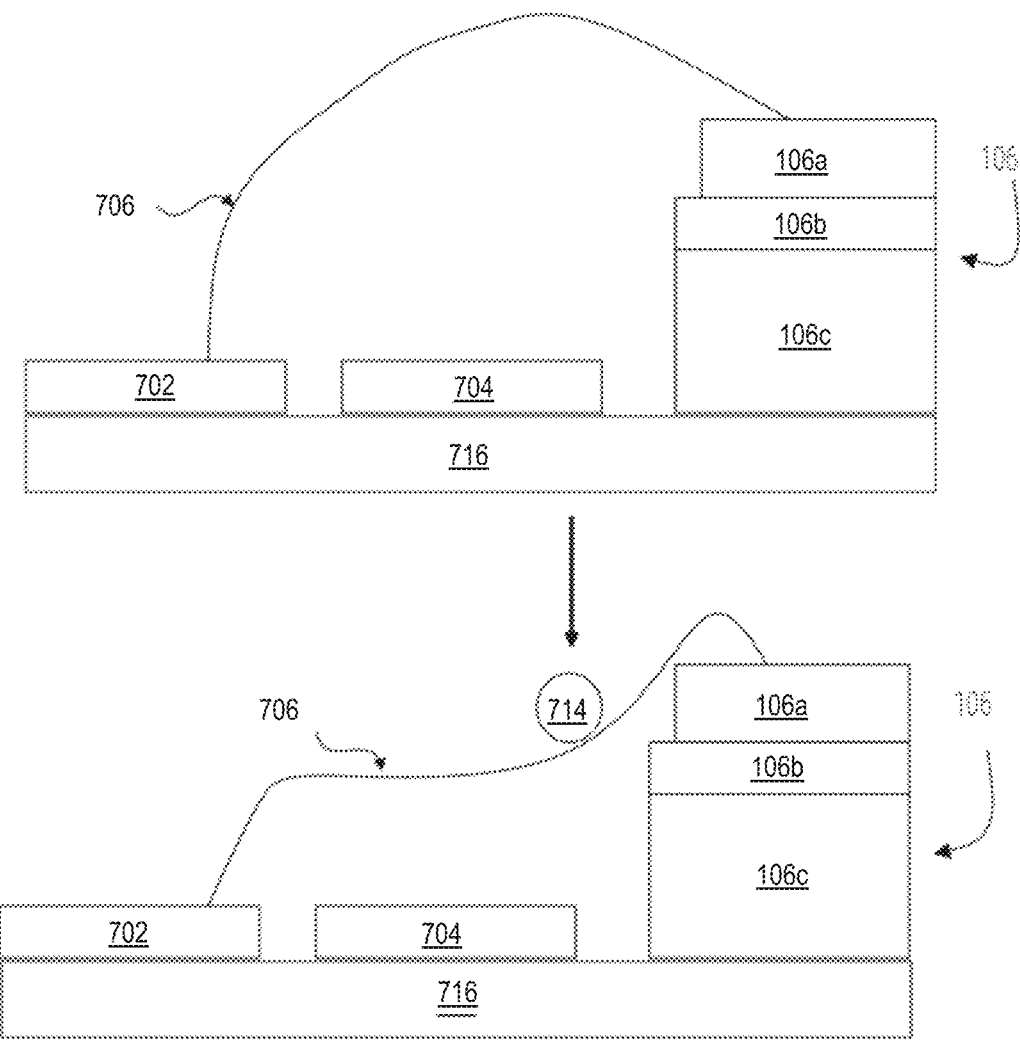
FIG. 7 is a side view of a bending process of the wiring within a cavity package according to exemplary aspects of the present disclosure.

Next, a method of bending the output wire 706 a predetermined height to reduce self-inductance and mutual inductance, is described with respect to FIG. 7. For the sake of clarity the shunt wire is not illustrated in FIG. 7. However, one of ordinary skill will appreciate that the shunt wire may be bent to a prescribed height in a substantially similar way as described herein with respect to the output wire 706. Moreover, in FIG. 7 the transistor die 702, substrate 704, and base metal 716 are substantially similar as the transistor dies, substrates, and base metals described above.

In FIG. 7, the output wire 706 is first attached to the output of the transistor die 702 and the output lead 106. Whether the output wire 706 is first attached to the output of the transistor die 702 and then the output lead 106, or whether the output wire 706 is first attached to the output lead 106 and then the output of the transistor die 702 is not limiting upon the present disclosure.

Once the output wire 706 is secured to both the transistor die 702 and the output lead 106, a structure 714 is used to exert force on the output wire 706 to cause the output wire 706 to bend to the desired shape. Of course, in the case where there are multiple output wires connecting multiple transistor outputs to multiple output leads, the structure 714 may be long enough to span all of the output wires to cause all of the output wires to simultaneously bend to the desired shape. Alternatively, each output wire may be bent into shape individually.

As will be described in greater detail below, the structure 714 may be a tool such as a bar that is introduced into the cavity package at the time of manufacture in order to bend the output wire 706 and then removed. The structure 714 may also be a wire that is temporarily attached to a side of the cavity and then drawn across the output wire(s) 706 to bend the output wire(s) 706. The output wire(s) 706 may also be bent into shape at the time of attachment to the transistor die 702 and/or the output lead 106 by the tool that attaches the output wire 706. Numerous other structures 714 for bending the output wire(s) 706 are also possible without departing from the scope of the present disclosure.

Figure 8:
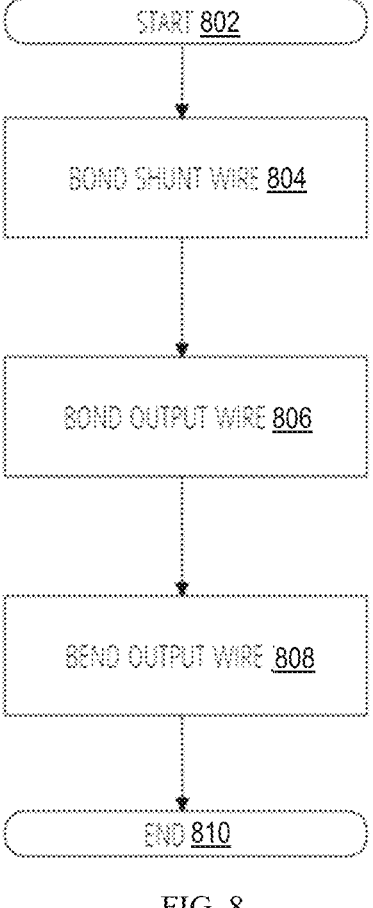
FIG. 8 is an algorithmic flowchart of a bending process for the wiring within a cavity package according to exemplary aspects of the present disclosure.

FIG. 8 is a flow chart of an exemplary process for inserting wires into a cavity package according to the present disclosure. The process begins at step 802 and proceeds to step 804 in which the shunt wire(s) is/are attached/bonded to the output of the transistor die and a substrate as described above with reference to FIGS. 2-6. At step 806 the output wire(s) is/are attached/bonded to the output of the transistor die and the output lead (or to a substrate and an output lead) as described above. At step 808 the output wire is bent using a structure such as the structure 714. Then the process ends at step 810.

Figure 9:
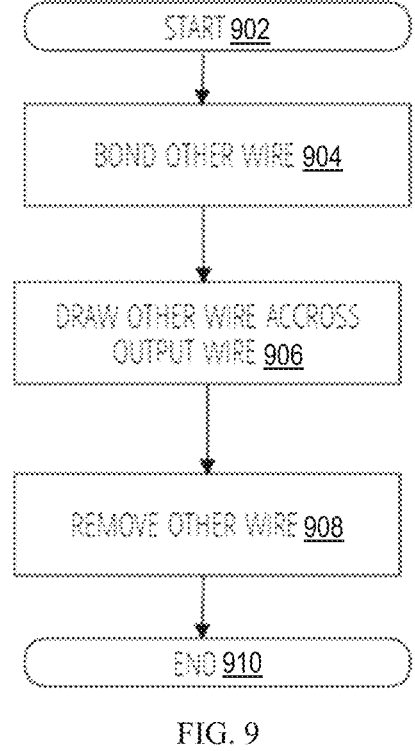
FIG. 9 is another algorithmic flowchart of a bending process for the wiring within a cavity package according to exemplary aspects of the present disclosure.

FIG. 9 is a flow chart of an exemplary process for inserting the wires into a cavity package in a case where another wire is used to bend the output wire. The process of FIG. 9 assumes that the shunt wire(s) and output wire(s) have already been installed in the cavity package. FIG. 9 then begins at step 902 and proceeds to step 904 in which another wire is bonded/attached to a side of the cavity package. At step 906 the other wire is drawn across, for example, the output wire, and once the output wire is bent to the desired shape, the other wire is removed at step 908. The process ends at step 910.

Figure 10:
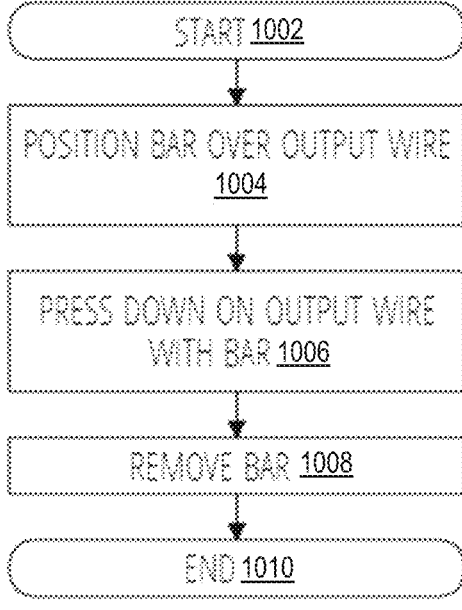
FIG. 10 is a further algorithmic flowchart of a bending process for the wiring within a cavity package according to exemplary aspects of the present disclosure.

FIG. 10 is a flow chart of an exemplary process for inserting the wires into a cavity package in a case where a bar is used to bend, for example, the output wire(s) into a desired shape. FIG. 10 also assumes that the shunt wire(s) and output wire(s) have already been installed in the cavity package. Then the process begins at step 1002 and proceeds to step 1004 where a bar is positioned at a predetermined location over the wire to be bent, for example, over the output wire. Then at step 1006, the bar is pressed downward into the output wire to cause the output wire to bend to the predetermined shape. At step 1008 the bar is removed, and the process ends at step 1010.

Obviously, numerous modifications and variations of the present disclosure are possible in light of the above teachings. It is therefore to be understood that within the scope of the appended claims, the disclosure may be practiced otherwise than as specifically described herein.

The invention claimed is:

1. A semiconductor device, comprising:
   a cavity package including a substrate and at least one output lead disposed higher than the substrate, when viewed in a side view, to create a cavity;
   a transistor die disposed within the cavity, a top surface of the transistor die being lower than a top surface of the output lead when viewed in the side view;
   a first matching network disposed within the cavity and separate from the transistor die, a top surface of the first matching network being lower than the top surface of the output lead when viewed in the side view;
   a shunt wire configured to connect an output of the transistor die to the first matching network; and
   an output wire configured to connect the output of the transistor die to the output lead of the cavity package,
   wherein a first position of the output wire is lower than a second position of the shunt wire above the first matching network, when viewed in the side view.

2. The semiconductor device according to claim 1, wherein the output wire has a downwardly convex shape, when viewed in the side view, relative to an imaginary line between the top surface of the output lead and the top surface of the transistor die.

3. The semiconductor device according to claim 1, wherein the output wire provided at a first position is lower than the top surface of the output lead in all areas above the first matching network, and
   the shunt wire provided at a second position is higher than the top surface of the output lead in a part of an area above the first matching network.

4. The semiconductor device according to claim 1, wherein the first portion of the output wire is a longest portion of the output wire.

5. The semiconductor device according to claim 1, wherein a length of the first portion of the output wire is given by a distance from a connection point of the output wire on the transistor die to a lowest point of the output wire relative to a straight line between the connection point of the transistor die and an edge of the output lead.

6. The semiconductor device according to claim 1, wherein the shunt wire has an upwardly convex shape when viewed in the side view.

7. The semiconductor device according to claim 6, wherein, in the side view, the shunt wire and the output wire cross at a substantially right angle with respect to each other.

8. The semiconductor device according to claim 1, further comprising:
   a second matching network disposed within the cavity electrically separate from the transistor die and the first matching network,
   wherein the output wire includes a first output wire connected between the output of the transistor die and the second matching network and a second output wire connected between the second matching network and the output lead, the first wire being maintained below the top surface of the output lead when viewed in the side view, and wherein a third position of the second output wire is lower than the second position of the shunt wire in an area above the first matching network.

9. The semiconductor device according to claim 8, wherein the second output wire is shorter than the first output wire.

10. The semiconductor device according to claim 8, wherein the first matching network is disposed between the transistor die and the second matching network when viewed in the side view.

11. The semiconductor device according to claim 8, wherein the second matching network and the first matching network are formed as a single integrated passive device (IPD).

12. The semiconductor device according to claim 8, further comprising:

a third matching network disposed within the cavity separate from the transistor die, the first matching network, and the second matching network, wherein the shunt wire includes a first shunt wire connected from the output of the transistor die to the third matching network and a second shunt wire connected from the third matching network to the capacitive element.

13. The semiconductor device according to claim 12, wherein, in the side view, the second and third matching networks are disposed between the transistor die and the first matching network, and the third matching network is disposed between the transistor die and the second matching network.

14. The semiconductor device according to claim 12, wherein, in the side view, the second matching network is disposed between the transistor die and the first matching network, and the second matching network is disposed between the third matching network and the output lead.

15. The semiconductor device according to claim 1, wherein the semiconductor device includes a radio frequency power amplifier and the transistor die includes a GaN HEMT transistor.

16. The semiconductor device according to claim 1, further comprising:

a second matching network disposed within the cavity separate from the transistor die and the first matching network, wherein the shunt wire includes a first shunt wire connected from the output of the transistor die to the second matching network and a second shunt wire connected from the second matching network substrate to the first matching network.

17. The semiconductor device according to claim 16, wherein the second matching network is disposed between the transistor die and the first matching network when viewed in the side view.

18. The semiconductor device according to claim 3, further comprising:

a second matching network disposed within the cavity separate from the transistor die and the first matching network, wherein the shunt wire includes a first shunt wire connected from the output of the transistor die to the second matching network and a second shunt wire connected from the second matching network to the first matching network.

19. The semiconductor device according to claim 4, further comprising:

a second matching network disposed within the cavity separate from the transistor die and the first matching network, wherein the shunt wire includes a first shunt wire connected from the output of the transistor die to the second matching network and a second shunt wire connected from the second matching network to the first matching network.

20. The semiconductor device according to claim 1, wherein the first matching network is a capacitive element.

* * * * *